(12) United States Patent
Hasunuma

(10) Patent No.: US 7,112,883 B2
(45) Date of Patent: Sep. 26, 2006

(54) SEMICONDUCTOR DEVICE WITH TEMPERATURE CONTROL MECHANISM

(75) Inventor: Masahiko Hasunuma, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/028,664

(22) Filed: Jan. 5, 2005

(65) Prior Publication Data

US 2006/0055028 A1 Mar. 16, 2006

(30) Foreign Application Priority Data

Sep. 10, 2004 (JP) .......................... P2004-263412

(51) Int. Cl.
*H01L 23/485* (2006.01)
*H01L 23/50* (2006.01)
*H01L 23/48* (2006.01)
*H01L 23/66* (2006.01)
*H05K 1/16* (2006.01)

(52) U.S. Cl. .............................. 257/714; 257/E33.075; 257/E31.131; 257/E23.051; 257/E23.021; 257/E23.079; 257/E23.114; 257/E25.013; 257/E23.069; 257/734; 257/738; 257/737; 257/772; 257/778; 257/712; 257/713; 257/717; 257/675; 257/721; 257/722; 257/719; 257/706; 257/668

(58) Field of Classification Search ................ 257/668, 257/700, 701, 758, 778, 734, 737, 738, 772, 257/779, 690–693, 698, 676, 712–717, 720–722, 257/706, 675, E33.075, E31.131, E23.051, 257/E23.021

See application file for complete search history.

(56) References Cited

U.S. PATENT DOCUMENTS

| 4,764,804 | A  | * | 8/1988  | Sahara et al. ................ 257/717 |
| 6,809,421 | B1 | * | 10/2004 | Hayasaka et al. ........... 257/777 |
| 2003/0160327 | A1 | | 8/2003 | Takamasa et al. |
| 2003/0218246 | A1 | * | 11/2003 | Abe et al. .................... 257/734 |
| 2004/0007384 | A1 | * | 1/2004  | Soga et al. .................. 174/260 |
| 2004/0056344 | A1 | * | 3/2004  | Ogawa et al. ............... 257/686 |
| 2004/0113238 | A1 | | 6/2004  | Hasunuma et al. |
| 2004/0183187 | A1 | * | 9/2004  | Yamasaki et al. ........... 257/700 |
| 2004/0218372 | A1 | * | 11/2004 | Hamasaki et al. .......... 361/767 |
| 2004/0245617 | A1 | * | 12/2004 | Damberg et al. ........... 257/686 |
| 2004/0251530 | A1 | * | 12/2004 | Yamaji ....................... 257/686 |
| 2005/0009329 | A1 | * | 1/2005  | Tanida et al. ............... 438/667 |
| 2005/0014311 | A1 | * | 1/2005  | Hayasaka et al. ........... 438/109 |
| 2005/0037535 | A1 | * | 2/2005  | Ogawa et al. ............... 438/106 |
| 2005/0116322 | A1 | * | 6/2005  | Sando et al. ................ 257/676 |
| 2005/0164490 | A1 | * | 7/2005  | Morrow et al. ............. 438/629 |
| 2005/0167833 | A1 | * | 8/2005  | Kobayashi et al. ......... 257/738 |
| 2005/0184391 | A1 | * | 8/2005  | Shimizu et al. ............. 257/738 |
| 2005/0186704 | A1 | * | 8/2005  | Yee et al. ................... 438/106 |

FOREIGN PATENT DOCUMENTS

| JP | 10-199882 | 7/1998 |
| JP | 2004-119969 | 4/2004 |

* cited by examiner

*Primary Examiner*—Alexander Oscar Williams
(74) *Attorney, Agent, or Firm*—Finnegan, Henderson, Farabow, Garrett & Dunner, L.L.P.

(57) ABSTRACT

A semiconductor device is provided, the semiconductor device including a semiconductor chip having a first metal heat-conductive medium in the inside thereof, a substrate having a second metal heat-conductive medium thermally connected to the first metal heat-conductive medium, and a temperature control device of which at least a part is disposed on the substrate, thermally connected to the second metal heat-conductive medium, and configured to control the temperature within the semiconductor chip.

19 Claims, 3 Drawing Sheets

SEMICONDUCTOR DEVICE WITH TEMPERATURE CONTROL MECHANISM

CROSS-REFERENCE TO THE INVENTION

This application is based upon and claims the benefit of priority from the prior Japanese Patent Application No. 2004-263412, filed on Sep. 10, 2004; the entire contents of which are incorporated herein by reference.

BACKGROUND OF THE INVENTION

1. Field of the Invention

The present invention relates to a semiconductor device.

2. Description of the Related Art

In recent years, a low resistance of a wiring resistance and a low dielectric constant of an interlayer insulation film have been promoted to improve a signal delay. Specifically, by changing a wiring material from Al to Cu, the wiring resistance is made to be a lower resistance. Besides, the interlayer insulation film is made to have a lower dielectric constant by applying a low dielectric constant insulating film (Low-k film) such as fluorine-doped $SiO_2$, $SiO_2$ film containing organic constituent, or an organic film instead of $SiO_2$, and further by the porosity of the low dielectric constant film. However, the lowering of the dielectric constant of the interlayer insulation film causes a problem of a deterioration of heat conductivity on the other hand. In particular, the porosity brings about a thermal storage effect within the interlayer insulation film.

Meanwhile, the power consumption is increasing by a speeding up and a high integration density of a semiconductor device, and a heating value from inside of a semiconductor chip is more increasing.

From these circumstances, in the current semiconductor chip, a heating value increases and the heat tends to stay. Therefore, a heat release only from the rear surface of an Si substrate is not sufficient for the heat release, and thereby, it brings about a rise of a chip temperature, and it is possible to bring about an operation failure, and further, a reliability failure.

To solve these heat dissipation problems, a method to release the heat by bonding a metal plate or a metal fin on the rear surface of the Si substrate is suggested. However, the heat dissipation effect thereof is insufficient and more improvement is required.

A method to form multilayered dummy wirings in the semiconductor chip and connect the dummy wirings each other through dummy vias, and transmit the heat through the dummy wirings, to release the heat from the surface layer of a semiconductor chip, is suggested (for example, refer to Japanese Patent Application Laid-open No. Hei 10-199882). However, the surface layer of the semiconductor chip is generally sealed by a low heat conductive resin for avoiding a corrosion from environment and for protecting from a mechanical destruction. Therefore, also in this case, the heat remains in the semiconductor chip after all, and it is insufficient as a heat dissipation effect.

BRIEF SUMMARY OF THE INVENTION

According to an aspect of the present invention, a semiconductor device, including: a semiconductor chip having a first metal heat conductive medium in the inside thereof; a substrate having a second metal heat conductive medium thermally connected to the first metal heat conductive medium; and a temperature control device of which at least a part is disposed on said substrate, thermally connected to the second metal heat conductive medium, and configured to control the temperature within said semiconductor chip, is provided.

DESCRIPTION OF THE EMBODIMENTS

First Embodiment

Figure 1:
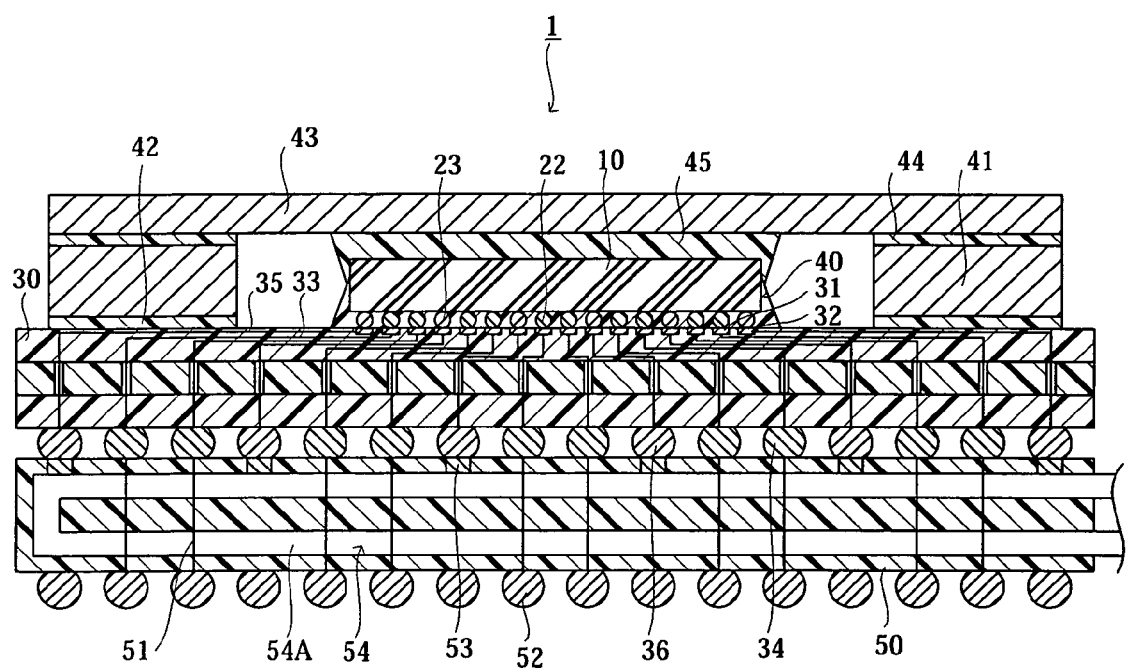
FIG. 1 is a schematic vertical sectional view of a semiconductor device according to a first embodiment.

Hereinafter, a first embodiment will be described. FIG. 1 is a schematic vertical sectional view of a semiconductor device according to the present embodiment, FIG. 2 is a schematic vertical sectional view of a semiconductor chip according to the present embodiment, and FIG. 3 is a schematic plane sectional view of the semiconductor chip according to the present embodiment.

Figure 2:
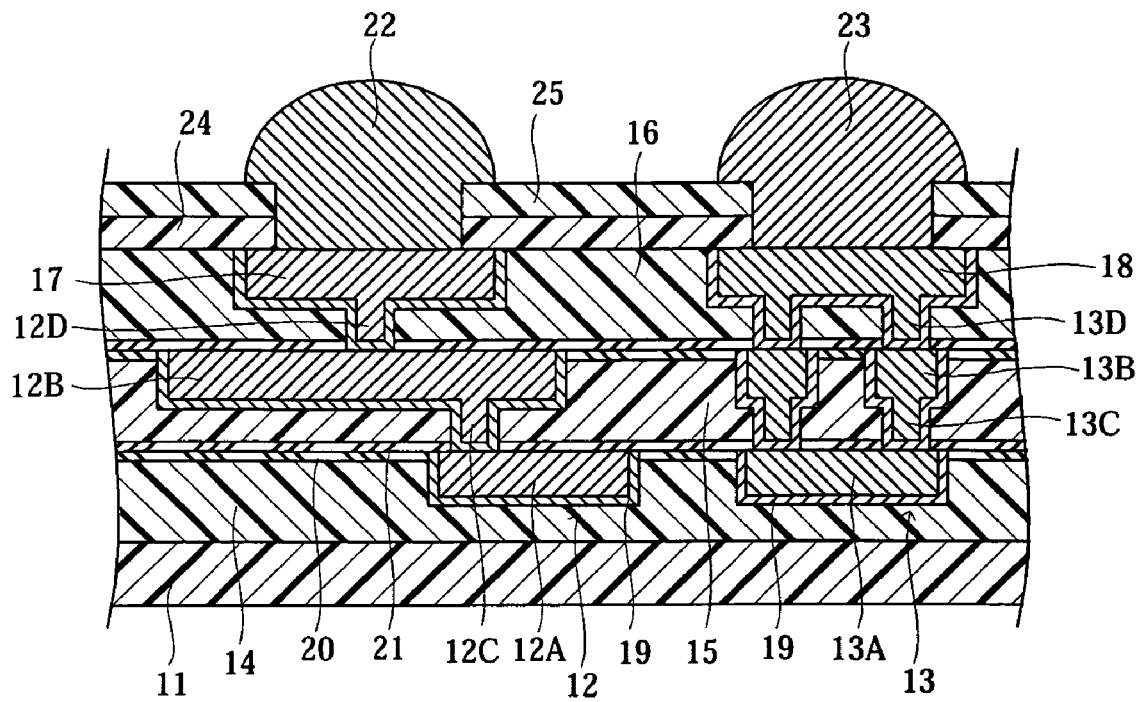
FIG. 2 is a schematic vertical sectional view of a semiconductor chip according to the first embodiment.
Figure 3:
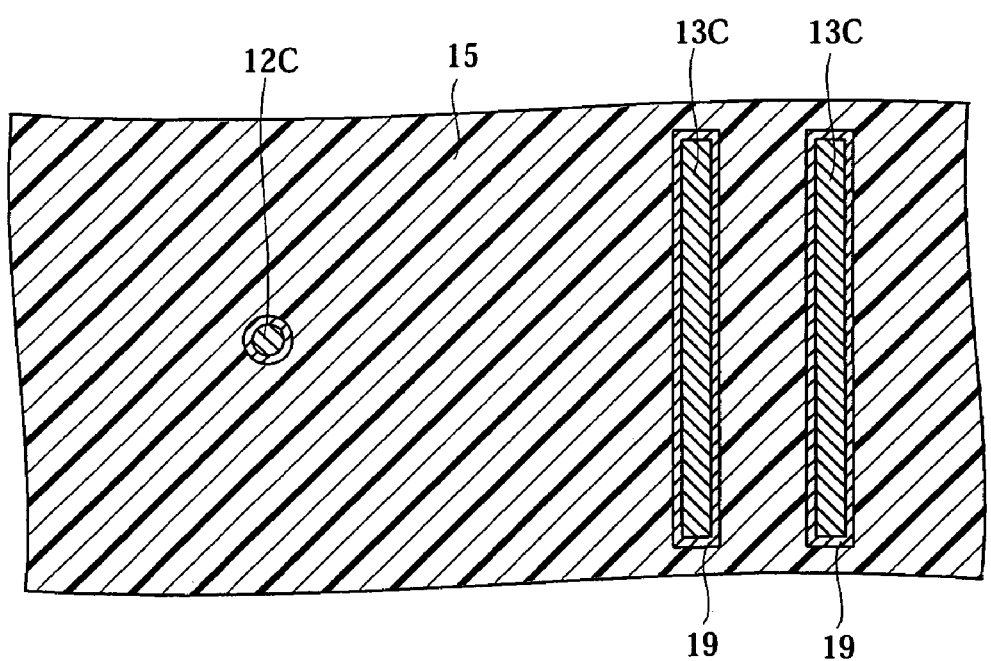
FIG. 3 is a schematic plane sectional view of the semiconductor chip according to the first embodiment.

As shown in FIG. 1 and FIG. 2, a semiconductor device 1 has a PBGA [FC] (flip-chip bonded Plastic Ball Grid Array) package structure. The semiconductor device 1 is composed of a semiconductor chip 10, and so on. The semiconductor chip 10 includes a semiconductor substrate 11 on which a semiconductor element (not shown) such as a transistor is formed. The semiconductor chip 10 may have a structure which is composed of two or more semiconductor chips, such as Chip on Chip structure, in one package.

On the semiconductor substrate 11, wirings 12 which function as actual wirings, and dummy wirings 13 (first metal heat conductive medium) which do not function as actual wirings but absorb a heat in the semiconductor chip 10 and transmit the heat to a later-described cooling module 54, are formed.

The wiring 12 is composed of wiring layers 12A, 12B, a via 12C connecting the wiring layer 12A and the wiring layer 12B, and a via 12D connecting the wiring layer 12B and a later-described electrode pad 17, and so on. Incidentally, in FIG. 2, the wiring layer 12B and the via 12C formed integrally is shown, but they may be formed separately. The wiring layers 12A, 12B, and the vias 12C, 12D are composed of metal, for example, Cu or the like.

The dummy wiring 13 is composed of dummy wiring layers 13A, 13B, a dummy via 13C connecting the dummy wiring layer 13A and the dummy wiring layer 13B, and a dummy via 13D connecting the dummy wiring layer 13B and a later-described dummy electrode pad 18, and so on. The dummy vias 13C, 13D may be column-shaped as well as the vias 12C, 12D, but preferably, they are elliptic cylinder-shaped or pattern formed in a wire state as shown in FIG. 2 and FIG. 3. Consequently, contact areas of the dummy vias 13C, 13D with later described interlayer insulation films 15, 16 become large, so that the more heat can be absorbed from the interlayer insulation films 15, 16.

Incidentally, in FIG. 2, the dummy wiring layer 13B and the dummy via 13C formed integrally is shown, but they may be formed separately. The dummy wiring layers 13A, 13B, and the dummy vias 13C, 13D are composed of metal, for example, Cu, Al, Ag, alloys of these, or the like.

Both the wirings 12 and the dummy wirings 13 have damascene wiring structures, and are formed in the interlayer insulation films 14 to 16. That is to say, the wiring layers 12A, 12B are respectively formed in wiring trenches formed on the interlayer insulation films 14, 15, and the vias 12C, 12D are respectively formed in via holes formed in the interlayer insulation films 15, 16. Besides, the dummy wiring layers 13A, 13B are respectively formed in dummy wiring trenches formed on the interlayer insulation films 14, 15, and the dummy vias 13C, 13D are respectively formed in dummy via holes formed in the interlayer insulation films 15, 16.

The wirings 12 and the dummy wirings 13 are insulated by the interlayer insulation films 14 to 16, and the dummy wirings 13 are formed at the positions departed from the wirings 12 not less than 1 µm nor more than 5 µm. Here, the reason why the dummy wirings 13 are formed at the positions departed from the wirings 12 not less than 1 µm nor more than 5 µm, is because it is possible to affect a lithographic process and a parasitic capacitance if the distance is less than 1 µm, and also, it becomes difficult to efficiently absorb the heat of the wirings 12 by the dummy wirings 13 if the distances are more than 5 µm. Further, the electric potential of the dummy wiring 13 is preferable to be a ground potential from the point of view of a stray capacitance.

Besides, electrode pad trenches and dummy electrode pad trenches are formed on the interlayer insulation film 16. The electrode pads 17 electrically connected to the wirings 12 are formed in the electrode pad trenches, and the dummy electrode pads 18 thermally connected to the dummy wirings 13 are formed in the dummy electrode pad trenches.

As a construction material of the interlayer insulation films 14 to 16, for example, $SiO_2$ film, a low dielectric constant insulating film such as organic Si oxide film, organic resin film, porous Si oxide film and so on, can be cited. The low dielectric constant insulating film is preferable to have a dielectric constant(k) not more than 3.0. As a construction material of the electrode pad 17 and the dummy electrode pad 18, metal, for example, Al, Cu, and so on can be cited.

Barrier metal films 19 for inhibiting the metal diffusion to the interlayer insulation films 14 to 16 are formed between the interlayer insulation films 14 to 16 and the wirings 12, between the interlayer insulation films 14 to 16 and the dummy wirings 13, and so on. As a construction material of the barrier metal film 19, a conductive material, for example, Ta, Ti, TaN, TiN, NbN, WN, VN, or the like, can be cited. Incidentally, the barrier metal film 19 can be formed by the layered materials of these.

Cap films 20 are formed for inhibiting an excessive polishing at the time of Chemical Mechanical Polishing (CMP) between the interlayer insulation film 14 and the interlayer insulation film 15, and between the interlayer insulation film 15 and the interlayer insulation film 16. As a construction material of the cap film 20, for example, $SiO_2$ based material can be cited. Incidentally, the cap film 20 is not formed on the wiring layers 12A, 12B, and the dummy wiring layers 13A, 13B.

On the cap films 20, top barrier films 21 are formed for inhibiting the metal diffusion to the interlayer insulation films 15, 16 being upper layers. As a construction material of the top barrier film 21, for example, SiCN, and so on can be cited. Incidentally, the top barrier films 21 are formed on the wiring layers 12A, 12B, and on the dummy wiring layers 13A, 13B, but openings are formed thereon to put through the vias 12C, 12D, and the dummy vias 13C, 13D.

On the electrode pads 17, bumps 22 electrically connected to the electrode pads 17 are formed, and on the dummy electrode pads 18, dummy bumps 23 thermally connected to the dummy electrode pads 18 are formed. As constitution materials of the bump 22 and the dummy bump 23, solder or metal such as Au, can be cited.

On the interlayer insulation film 16, a passivation film 24 and a polyimide film 25 are formed. Incidentally, on the passivation film 24 and on the polyimide film 25, openings are formed to put through the bumps 22 and the dummy bumps 23.

The semiconductor chip 10 is mounted on a package substrate 30 in a face down manner. Specifically, the bumps 22 are electrically connected to electrode pads 31 formed on the upper surface of the package substrate 30, and the dummy bumps 23 are thermally connected to electrode pads 32 formed on the upper surface of the package substrate 30. In this manner, the connection between the electrode pads 17 of the semiconductor chip 10 and the electrode pads 31 of the package substrate 30, and the connection between the dummy electrode pads 18 of the semiconductor chip 10 and the dummy electrode pads 32 of the package substrate 30 are made to be the same connection mode using, for example, the bumps 22 and the dummy bumps 23. Consequently, the electrical and the thermal connections between both become possible without causing a complication in the manufacturing process, in particular. Incidentally, the package substrate 30 can comprise a Si interposer.

The electrode pads 31 are electrically connected to BGA balls 34 disposed at the lower surface of the package substrate 30 through wirings 33 formed inside of the package substrate 30. The dummy electrode pads 32 are thermally connected to dummy BGA balls. 36 disposed at the lower surface of the package substrate 30 through dummy wirings 35 (second metal heat conductive medium) formed inside of the package substrate 30. As a constitution material of the wiring 33, the same constitution material as the wiring 12 can be cited. As a constitution material of the dummy wiring 35, the same constitution material as the dummy wiring 13 can be cited.

Between the semiconductor chip 10 and the package substrate 30, an underfill resin 40 is filled to absorb strain added to the bumps 22, and so on, or to prevent a fatigue fracture of the bumps 22, and so on, at the time of heat cycle.

On the upper surface of the package substrate 30, a frame-shaped reinforcing plate 41 is fixed by an adhesive 42, so as to surround the semiconductor chip 10. Besides, on the upper surface of the reinforcing plate 41, a cover plate 43 is fixed by an adhesive 44 so as to cover the semiconductor chip 10. A thermal paste 45 is filled between the semiconductor chip 10 and the cover plate 43 so as to absorb the heat generated in the semiconductor chip 10 and transmit it to the cover plate 43.

At the lower surface side of the package substrate 30, a cooling substrate (substrate) 50 is disposed. The BGA balls 34 are electrically connected to bumps 52 disposed at the lower surface of the cooling substrate 50, through wirings 51 formed inside of the cooling substrate 50. The dummy BGA balls 36 are thermally connected to a pipe 54A of a cooling module 54 (temperature control device) disposed in the cooling substrate 50 through dummy wirings 53 (second metal heat conductive medium) formed inside of the cooling substrate 50.

The cooling module 54 is for controlling a temperature of the semiconductor chip 10, and composed of the pipe 54A, a heat exchanger (not shown), as a cooling module, configured to supply the pipe 54A with a cooling medium and configured to cool the cooling medium through the pipe 54A, and so on. As the cooling medium, for example, liquid such as water, liquid nitrogen, inert gas and so on, or gas can be cited.

The cooling module 54 is thermally connected to the dummy wirings 13 in the semiconductor chip 10 through the dummy electrode pads 18, and so on. Incidentally, in the present embodiment, a case when the cooling module 54 is used as the temperature control device is explained, but instead of the cooling module 54, or together with the cooling module 54, a heat sink plate, a heat sink fin, a peltier element, or the like, can be used. The wiring 51 is composed of the same metal as the wiring 12, and the dummy wiring 53 is composed of the same metal as the dummy wiring 13.

In the present embodiment, the dummy wirings 13 are formed inside of the semiconductor chip 10, the dummy wirings 35, 53, thermally connected to the dummy wirings 13 respectively are formed at the package substrate 30 and at the cooling substrate 50. Further, the pipe 54A thermally connected to the dummy wirings 53 is disposed at the cooling substrate 50. Therefore, it is possible to surely release the heat within the semiconductor chip 10 out of the semiconductor chip 10 through the dummy wirings 13, and so on. Consequently, the semiconductor device 1 with high reliability can be provided.

In the present embodiment, the heat within the semiconductor chip 10 is released out of the semiconductor chip 10 through the dummy bumps 23, and therefore, the occurrence of a corrosion can be restrained at the electrode pads 17 and the bumps 22. Namely, it is possible that the corrosion may occur at the electrode pads 17 and the bumps 22 by the moisture contained in the atmosphere and the heat stayed in the electrode pads 17 and the bumps 22. However, in the present embodiment, the heat within the semiconductor chip 10 is released outside through the dummy bumps 23, and therefore the heat stayed in the electrode pads 17 and the bumps 22 can be reduced. Consequently, the occurrence of the corrosion at the electrode pads 17 and the bumps 22 can be restrained.

In the present embodiment, the thermal paste 45 is interposed between the semiconductor chip 10 and the cover plate 43. Therefor, the heat dissipation can be performed also from the rear surface side of the semiconductor chip 10. Consequently, the semiconductor device 1 with higher reliability can be provided.

Practical Example

Hereinafter, a practical example will be explained. In the present example, a semiconductor chip having almost the same structure as the semiconductor chip in the first embodiment is used. An interlayer insulation film is composed of a low dielectric constant insulating film having 5 GPa of Young's modulus, 40 ppm of linear expansion coefficient, and the thickness is approximately 300 nm. A barrier metal film is composed of a stacked film of Ta/TaN, and the thickness is approximately 10 nm. The barrier metal film is formed by a sputtering with applying a bias. Wirings and dummy wirings are made by forming Cu seed film of 70 nm thickness by a mat film conversion by using an SIS (Self Ionized Sputter) manner sputter, and thereafter forming Cu plating film by electrolytic plating, and removing unnecessary plating film by CMP. Incidentally, the diameter of a via and the width of a dummy via in a wire state are 0.13 μm. A cap film is composed of d-TEOS, and the thickness thereof is approximately 50 nm. An electrode pad and a dummy electrode pad are composed of Al, and a bump and a dummy bump are composed of PbSn.

A plurality of the dummy bumps of such a semiconductor chip thermally connected to peltier elements through a cooling substrate are prepared, a high temperature operation test under 150° C. is performed, and an operation failure rate is examined. Here, the respective operation failure rates when the peltier element is operated and it is not operated during the high temperature operation test are examined. When the peltier element is operated during the high temperature operation test, the peltier element is set to be approximately 20° C. Further, the occurrence of a corrosion at the electrode pads and the bumps is examined by performing a disassembly analysis after the test. Incidentally, the same test is performed to a semiconductor chip not forming dummy wirings.

Hereinafter the results will be described. As for the semiconductor chip in which the dummy wirings are not formed, the operation failure rate is 2000 ppm. On the contrary, as for the semiconductor chip in which the dummy wirings are formed, no operation failure is seen when the peltier element is operated during the high temperature operation test. Besides, even when the peltier element is not operated during the high temperature operation test, the operation failure rate is 500 ppm. From this result, it is verified that when the dummy wirings are formed in the semiconductor chip and the dummy wirings are thermally connected to the peltier elements, the heat dissipation effect is high to be rare to occur the operation failure of the semiconductor element, compared to the case when the dummy wirings are not formed.

According to the result of the disassembly analysis after the test, when the dummy wirings are formed in the semiconductor chip and the peltier elements are operated during the high temperature operation test, or when the dummy wirings are formed in the semiconductor chip and the peltier elements are not operated during the test, the corrosion is not occcurred at the electrode pads and the bumps, and the device operation has no trouble. Further, the same test is performed for a semiconductor chip in which dummy vias having the diameter of 0.13 μm are disposed by every 10 μm relative to the dummy wirings, instead of the dummy vias in a wire state having the width of 0.13 μm, the equivalent result can be obtained. Consequently, it turned out that when the dummy vias are disposed with the interval of under 10 μm, the sufficient heat dissipation effect can be attained.

Second Embodiment

Figure 4:
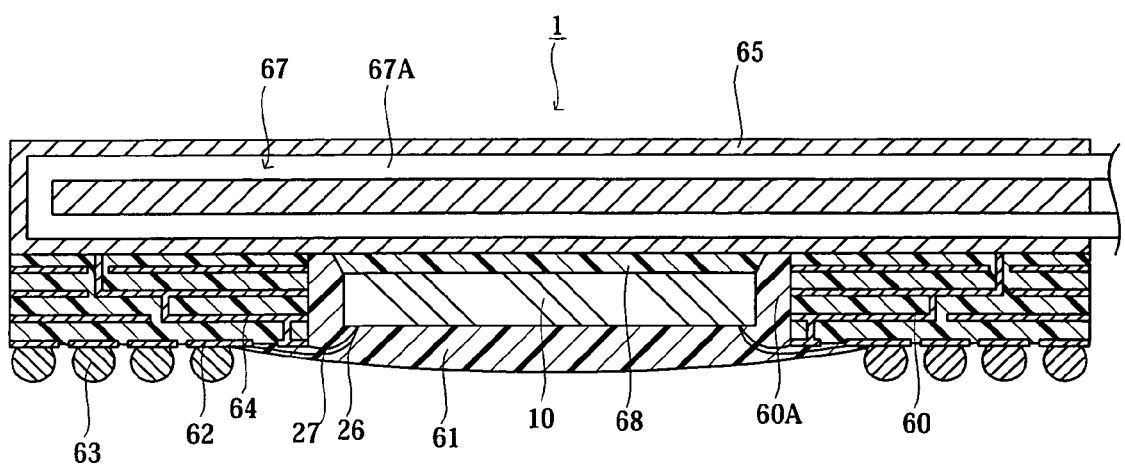
FIG. 4 is a schematic vertical sectional view of a semiconductor device according to a second embodiment.

Hereinafter, a second embodiment will be described. Incidentally, the redundant description with the first embodiment may be abbreviated. FIG. 4 is a schematic vertical sectional view of a semiconductor device according to the present embodiment.

As shown in FIG. 4, a semiconductor device 1 has an EBGA (Enhanced Ball Grid Array) package structure. A semiconductor chip 10 is disposed in a package substrate 60. Specifically, an opening 60A is formed at the center portion of the package substrate 60, and the semiconductor chip 10 is disposed in the opening 60A. The semiconductor chip 10 is covered with a potting resin 61.

Bonding wires 26 are electrically connected to electrode pads 17 of the semiconductor chip 10 instead of the bumps 22, and dummy bonding wires 27 are thermally connected to dummy electrode pads 18 instead of the dummy bumps 23. The bonding wires 26 are electrically connected to BGA balls 63 provided at the lower surface of the package substrate 60 through wirings 62 formed inside of the package substrate 60. The dummy bonding wires 27 are thermally connected to a heat sink plate 65 provided at the upper surface of the package substrate 60 through dummy wirings 64 (second metal heat conductive medium) formed inside of the package substrate 60. The heat sink plate 65 is composed of metal.

In the heat sink plate 65, a pipe 67A of a cooling module 67 is disposed. The cooling module 67 has the same structure as the cooling module 54 described in the first embodiment. A thermal paste 68 is filled between the semiconductor chip 10 and the heat sink plate 65.

In the present embodiment, dummy wirings 13 are formed inside of the semiconductor chip 10, the dummy wirings 64 which are thermally connected to the dummy wirings 13 are formed at the package substrate 60, and the heat sink plate 65 and the pipe 67A thermally connected to the dummy wirings 64 are disposed at the package substrate 60. Therefore, the heat within the semiconductor chip 10 can be surely released out of the semiconductor chip 10 as well as in the first embodiment, so that the semiconductor device 1 with high reliability can be provided.

In the present embodiment, the thermal paste 68 is interposed between the semiconductor chip 10 and the heat sink plate 65. Therefore, the heat dissipation can be performed from the rear surface side of the semiconductor chip 10, so that the semiconductor device 1 with higher reliability can be provided.

Incidentally, the present invention is not limited to the contents described in the above embodiments, and appropriate changes in the structure, the materials, the arrangement of each member, and so on may be made within a range not departing from the substance of the present invention. For example, the pipes 54A, 67A of the cooling modules 54, 67 can be disposed in the package substrates 30, 60. Besides, the pipe 54A of the cooling module 54 can be disposed at the front face of the cooling substrate 50. Further, the number of layers of the wiring layers 12A, 12B, and the dummy wiring layers 13A, 13B is not particularly limited, and they may be any number of layers.

What is claimed is:

1. A semiconductor device, comprising:
   a semiconductor chip having a first metal heat-conductive medium in the inside thereof;
   a substrate having a second metal heat-conductive medium thermally connected to the first metal heat-conductive medium; and
   a temperature control device of which at least a part is disposed on said substrate, thermally connected to the second metal heat-conductive medium, and configured to control the temperature within said semiconductor chip,
   wherein said temperature control device is at least either of a heat sink plate, a heat sink fin, a peltier element, and a cooling module whose cooling medium is liquid or gas.

2. The semiconductor device according to claim 1, wherein the first metal heat-conductive medium is a dummy wiring.

3. The semiconductor device according to claim 2, wherein the dummy wiring includes a plurality of dummy wiring layers and a dummy via connecting between the dummy wiring layers.

4. The semiconductor device according to claim 3, wherein the dummy via is elliptic cylinder-shaped or pattern formed in a wire state.

5. The semiconductor device according to claim 3, wherein the dummy wiring layers and the dummy via are composed of metal.

6. The semiconductor device according to claim 5, wherein the metal is Cu, Al, Ag, or alloys of thereof.

7. The semiconductor device according to claim 2, wherein the dummy wiring is formed in a insulation film formed in said semiconductor chip, and the insulation film comprises a low dielectric constant insulating film having a dielectric constant not more than 3.0.

8. The semiconductor device according to claim 1, wherein the second metal heat-conductive medium is a dummy wiring.

9. The semiconductor device according to claim 8, wherein the dummy wiring is composed of metal.

10. The semiconductor device according to claim 1, wherein the first metal heat-conductive medium and the second metal heat-conductive medium are thermally connected through a dummy bump.

11. The semiconductor device according to claim 2, wherein the electric potential of the dummy wiring is a ground potential.

12. The semiconductor device according to claim 1, wherein the first metal heat conductive medium and the second metal heat conductive medium are thermally connected through a dummy bonding wire.

13. The semiconductor device according to claim 2, wherein said semiconductor chip further includes a wiring, and the wiring and the dummy wiring are insulated.

14. The semiconductor device according to claim 13, wherein the distance between the wiring and the dummy wiring is not less than 1 μm nor more than 5 μm.

15. The semiconductor device according to claim 2, wherein said semiconductor chip further includes a wiring, and the wiring and the dummy wiring have damascene wiring structures.

16. The semiconductor device according to claim 1, wherein said semiconductor chip and said substrate further include a wiring respectively, and the wiring of said semiconductor chip and the wiring of said substrate are electrically connected in the same connection mode as the thermal connection between the first metal heat-conductive medium and the second metal heat-conductive medium.

17. The semiconductor device according to claim 1, wherein the cooling medium of the cooling module is water, liquid nitrogen, or inert gas, and the cooling medium is connected to an another cooling module configured to cool the cooling medium through a pipe.

18. The semiconductor device according to claim 1, further comprising:
   a heat sink plate covering said semiconductor chip; and
   a thermal paste filled between said semiconductor chip and the heat sink plate.

19. The semiconductor device according to claim 18, wherein said semiconductor chip includes a semiconductor substrate and a wiring structure disposed above said semiconductor substrate and having said first metal heat conductive medium therein, and said thermal paste is filled between said semiconductor substrate and the heat sink plate.

* * * * *